United States Patent [19]

Kazui

[11] Patent Number: 5,585,819
[45] Date of Patent: Dec. 17, 1996

[54] METHOD AND APPARATUS FOR DETECTING ALIASING

[75] Inventor: Kenji Kazui, Yokohama, Japan

[73] Assignee: Matsushita Electric Industrial Co., Ltd., Osaka, Japan

[21] Appl. No.: 974,718

[22] Filed: Nov. 12, 1992

[30] Foreign Application Priority Data

Nov. 19, 1991 [JP] Japan ................................ 3-303282

[51] Int. Cl.⁶ .................................................. G09G 5/36
[52] U.S. Cl. ............................................ 345/134; 345/117
[58] Field of Search ................................ 345/117, 134, 345/136; 364/487; 324/121 R

[56] References Cited

U.S. PATENT DOCUMENTS 4,763,067  8/1988  Fladstol .................... 345/134
5,028,914  7/1991  Povenmire ................ 345/134
5,119,018  6/1992  Katayama et al. ........ 345/134

FOREIGN PATENT DOCUMENTS 5948658  3/1984  Japan .

Primary Examiner—Richard Hjerpe
Assistant Examiner—Kara Farnandez Stoll
Attorney, Agent, or Firm—Watson Cole; Stevens Davis, P.L.L.C.

[57] ABSTRACT

In a method and apparatus for detecting occurrence of aliasing in a digital oscilloscope and displaying an alarm on a display unit, when an input signal is applied to a trigger generator circuit, the trigger generator circuit generates a trigger pulse. An aliasing detection counter counts the number of the trigger pulses generated in the period of time between scan clock pulses generated from a timebase circuit and applies an aliasing detection signal to a CPU. The CPU displays on the display unit the message indicating occurrence of aliasing.

7 Claims, 5 Drawing Sheets

METHOD AND APPARATUS FOR DETECTING ALIASING

BACKGROUND OF THE INVENTION

1. Field of the Invention

This invention relates to a method and apparatus used in, for example, a digital oscilloscope for detecting occurrence of aliasing.

2. Description of the Related Art

A prior art aliasing detecting apparatus of this kind used in, for example, a digital oscilloscope is disclosed in JP-A-59-48658. The term "aliasing" referred to above designates the phenomenon that occurs when the frequency of a sampling pulse signal (clock) A is less than two times as much as that of an analog input signal S, as shown in FIG. 6. It will be seen in FIG. 6 that, after D/A conversion of the sampled data P again, the waveform of the reproduced analog signal S' has a frequency lower than the actual frequency of the input signal S.

FIG. 5 is a block diagram schematically showing the structure of the prior art aliasing detecting apparatus. Referring to FIG. 5, the prior art aliasing detecting apparatus includes a sampling pulse counter 1, a reset pulse generator 2, an input signal cycle counter 3 and an error detector 4. The sampling pulse counter 1 divides the frequency of a sampling pulse A thereby generating a sampling pulse count signal B. The reset pulse generator 2 detects the rising edge or falling edge of the sampling pulse count signal B applied from the sampling pulse counter 1 thereby generating a reset pulse C. The input signal cycle counter 3 generates an error detection signal E when a signal D obtained by converting an analog input signal into a binary signal rises or falls two or more times within a predetermined period of time. The error detector 4 displays occurrence of aliasing on an external display unit such as an LED. In the prior art apparatus, the reset pulse generator 2 generates one reset pulse C each time it receives three sampling pulses. The fact that the signal D rises or falls two or more times within the above period of time means that the frequency of the input signal exceeds ½ of the sampling frequency, and undesirable aliasing is occurring. When such a situation is detected, an alarm is issued to the user of, for example, a digital oscilloscope so as to prevent wrong operation of the digital oscilloscope.

However, the prior art aliasing detecting apparatus has had the problem that, because the sampling period counter and the reset pulse generator are essentially required, the circuit scale is inevitably correspondingly increased. Another problem of the prior art aliasing detecting apparatus is how to convert its input signal into a binary signal.

SUMMARY OF THE INVENTION

With a view to solve such prior art problems, it is an object of the present invention to provide an excellent method and apparatus which can detect occurrence of aliasing in spite of a circuit construction simpler than that of the prior art and which can detect occurrence of aliasing with high accuracy.

A first embodiment of the present invention comprises a counter connected to a trigger detector circuit in each of a plurality of channels to count the number of trigger signals appearing within the period of time of one sweep cycle or the period of time which is n times (n: an integer) as long as the period of the sweep cycle, so that the number of the counted trigger signals is based to detect and display occurrence of aliasing.

A second embodiment of the present invention comprises an A/D converter for converting an input signal into digital data, peak detector circuits for detecting a maximum value and a minimum value of the digital data in a first predetermined period of time so as to set two reference values on the basis of the detected maximum and minimum values, and counters for counting the number of the digital data exceeding the reference values in a second predetermined period of time, so that the number of the counted digital data is based to detect and display occurrence of aliasing.

Therefore, according to the first embodiment of the present invention, the apparatus of a very simple construction can detect occurrence of aliasing, and, by supplying the outputs of the counters to a central processing unit (CPU), occurrence of the aliasing can be displayed on a display unit such as a CRT.

Further, according to the second embodiment of the present invention, occurrence of aliasing can be accurately detected from the waveform of the input signal, and, by supplying the outputs of the counters to a CPU, occurrence of the aliasing can be displayed on a display unit such as a CRT.

DESCRIPTION OF THE PREFERRED EMBODIMENTS

Figure 1:
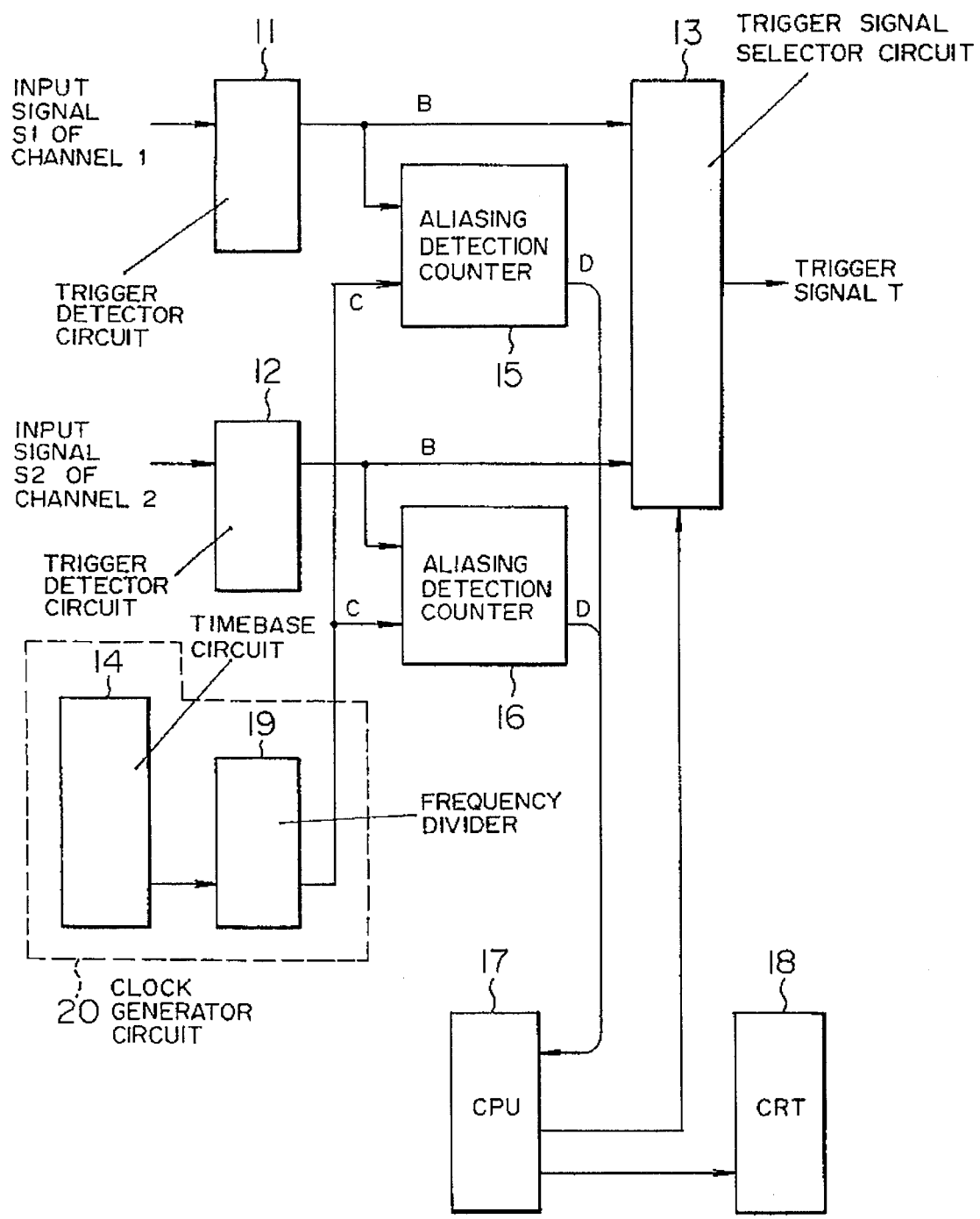
FIG. 1 is a block diagram showing the structure of a first embodiment of the aliasing detecting apparatus according to the present invention.

FIG. 1 is a block diagram showing the structure of a first embodiment of the aliasing detecting apparatus according to the present invention. Referring to FIG. 1, trigger detector circuits 11 and 12 generate trigger signals (pulses) when they receive input signals S1 and S2 of channels 1 and 2 respectively. These trigger detector circuits 11 and 12 are connected to a trigger signal selector circuit 13. A clock generator circuit 20 is composed of a timebase circuit 14 and a frequency divider 19. The timebase circuit 14 generates a clock signal corresponding to the sweep rate. For the simplicity of the structure of the circuit 20, the frequency divider 19 may be eliminated. The clock signal corresponding to the sweep rate or a clock signal produced by the frequency division is supplied from the clock generator circuit 20 to aliasing detection counters 15 and 16. A CPU 17 receives aliasing detection signals from the aliasing detection counters 15 and 16 to display on a CRT 18 a message indicating occurrence of aliasing when aliasing is detected.

Figure 2:
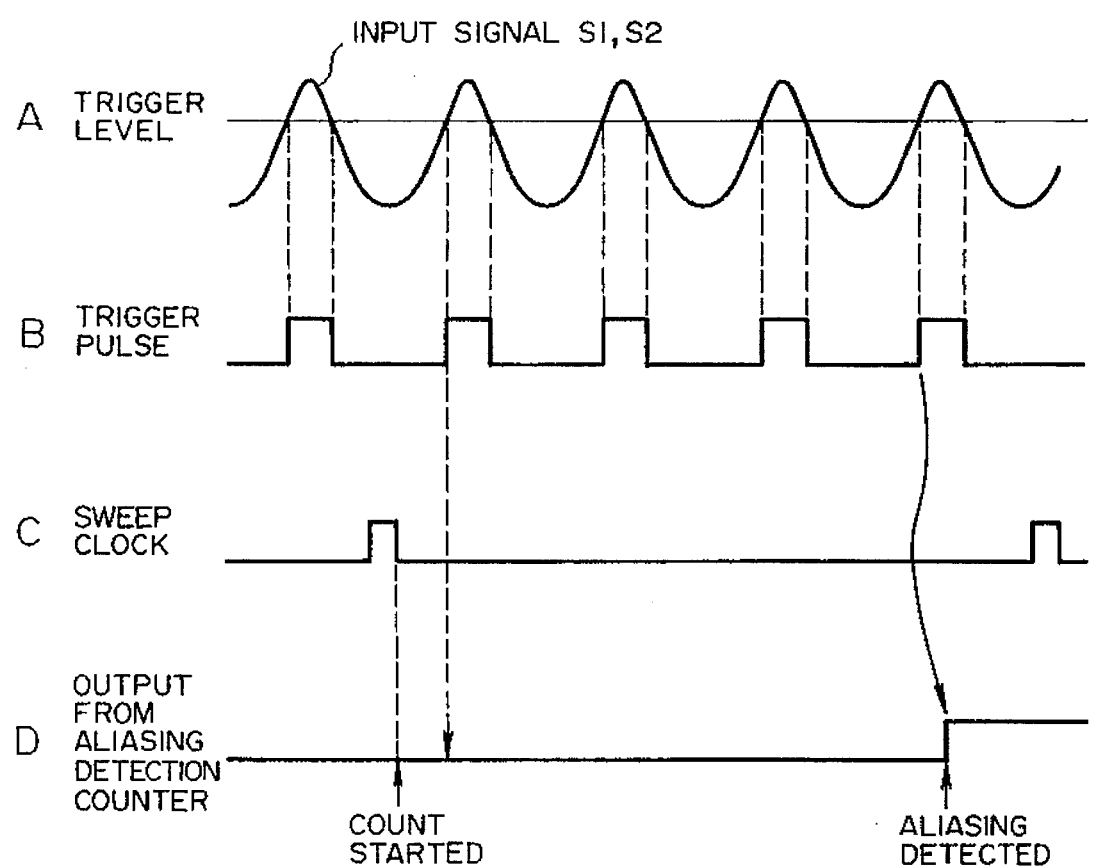
FIG. 2 is a timing chart of the operation of the circuits of the apparatus shown in FIG. 1.

The operation of the first embodiment of the aliasing detecting apparatus of the present invention will now be described by reference to a timing chart shown in FIG. 2. The two input signals S1 and S2 of the channels 1 and 2 are applied to the trigger detector circuits 11 and 12 respectively in the first embodiment of the aliasing detecting apparatus shown in FIG. 1. Each time the level of the input signal S1 or S2 exceeds a trigger level A as shown in FIG. 2, the trigger detector circuit 11 or 12 generates a trigger pulse signal B as shown in FIG. 2. When the frequency divider 19 is not included in the clock generator circuit 20, a number of the trigger pulses B generated between the sweep clock pulses C (shown in FIG. 2) outputted from the timebase circuit 14 is counted by the associated aliasing detection counter 15 or 16. When the count of the aliasing detection counter 15 or 16 exceeds a predetermined number of times selected to indicate occurrence of aliasing, an aliasing detection signal D as shown in FIG. 2 is applied from the aliasing detection counter 15 or 16 to the CPU 17. As soon as the CPU 17 receives this aliasing detection signal D from the aliasing detection counter 15 or 16, the CPU 17 displays on the CRT 18 the message indicating occurrence of the aliasing.

Thus, according to the first embodiment of the aliasing detecting apparatus, when the trigger pulses B are generated from the trigger detector circuit 11 or 12, the number of the trigger pulses B appearing between the sweep clock pulses C is counted by the aliasing detection counter 15 or 16. When the number of the counted trigger pulses exceeds the predetermined number of times, the aliasing detection signal D is applied to the CPU 17, and the message indicating occurrence of the aliasing is displayed on the CRT 18.

It is apparent that the accuracy of aliasing detection is improved when the frequency of the sweep clock signal generated from the timebase circuit 14 is divided by the frequency divider 19, and the number of the trigger pulses B appearing between the adjacent two of divided clock pulses is counted. Suppose, for example, that the frequency of the sweep clock signal generated from the timebase circuit 14 is divided by the frequency divider 19 to produce clock pulses having a clock period sixteen times as long as the sampling period in the A/D converter. In such a case, occurrence of aliasing is detected when the number of the trigger pulses B detected within one clock period is nine or more.

Further, according to the first embodiment of the aliasing detecting apparatus, the trigger signal selector circuit 13 outputs the actual trigger signal T. Therefore, the first embodiment is advantageous in that occurrence of aliasing can be detected for each of the plural input channels when the combination of the trigger detector circuit 11 and the aliasing detection counter 15 is prepared by the number equal to the number of the input channels.

Figure 3:
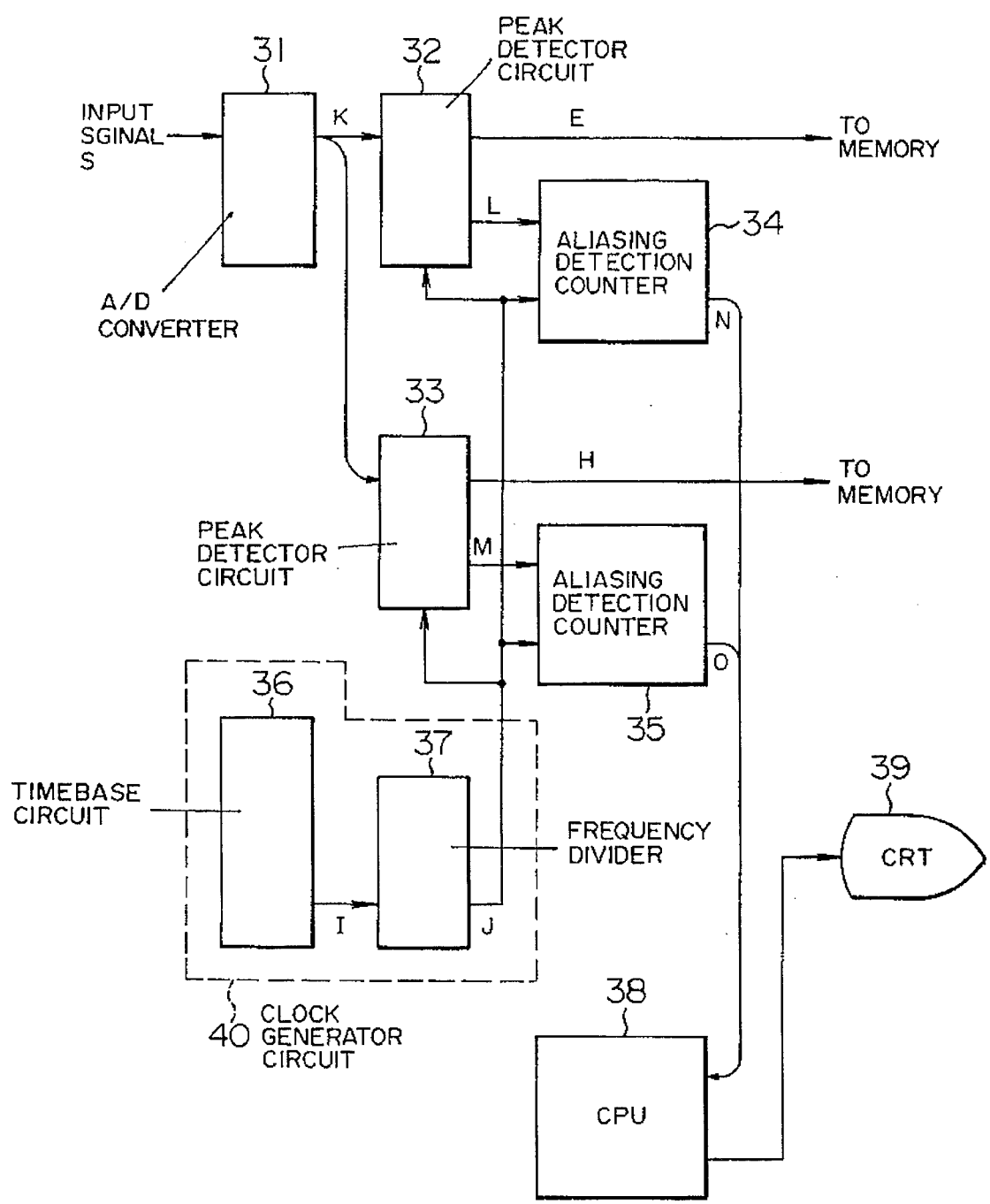
FIG. 3 is a block diagram showing the structure of a second embodiment of the aliasing detecting apparatus according to the present invention.

FIG. 3 is a block diagram showing the structure of a second embodiment of the aliasing detecting apparatus of the present invention. Referring to FIG. 3, an A/D converter 31 is connected to peak detector circuits 32 and 33 each functioning to detect the peak value of an input signal S. These peak detector circuits 32 and 33 are utilized so as to detect a maximum value and a minimum value of the input signal S, respectively, in each sweep cycle. A clock generator circuit 40 is composed of a timebase circuit 36 and a frequency divider 37. The frequency of the sweep clock signal outputted from the timebase circuit 36 is divided by the frequency divider 37 by the factor of two, and this clock signal is applied to each of aliasing detection counters 34 and 35. When occurrence of aliasing is detected by the aliasing detection counter 34 or 35, and aliasing detection signals are generated from these counters, a CPU 38 receives the aliasing detection signals to display on a CRT 39 the message indicating occurrence of the aliasing.

Figure 4:
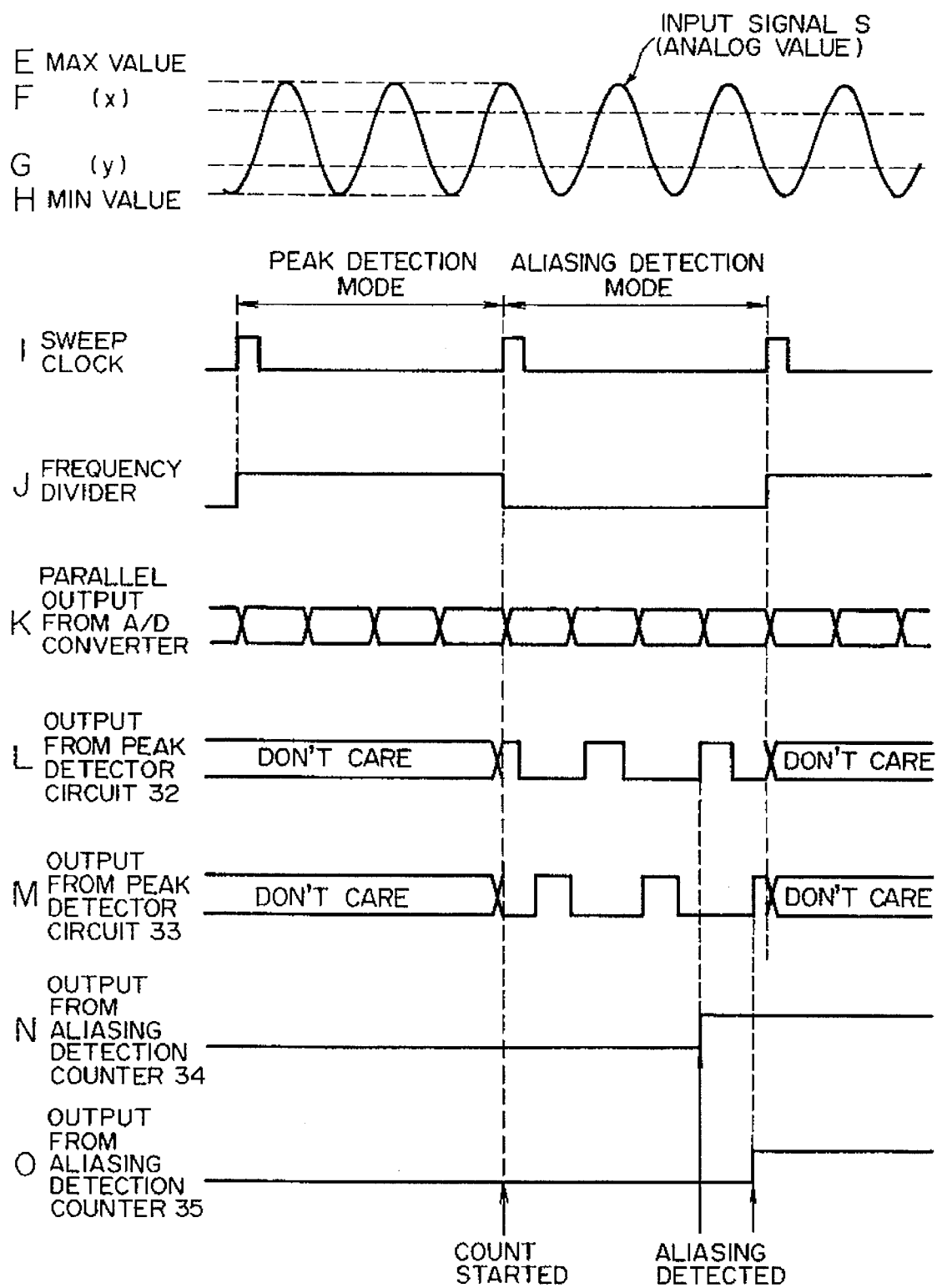
FIG. 4 is a timing chart of the operation of the circuits of the apparatus shown in FIG. 3.
Figure 5:
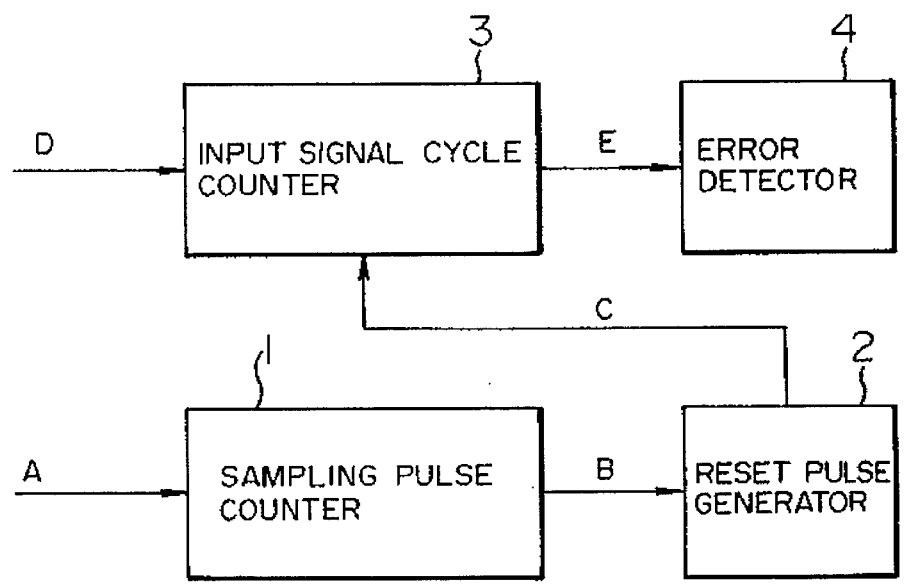
FIG. 5 is a block diagram schematically showing the structure of a prior art aliasing detecting apparatus.
Figure 6:
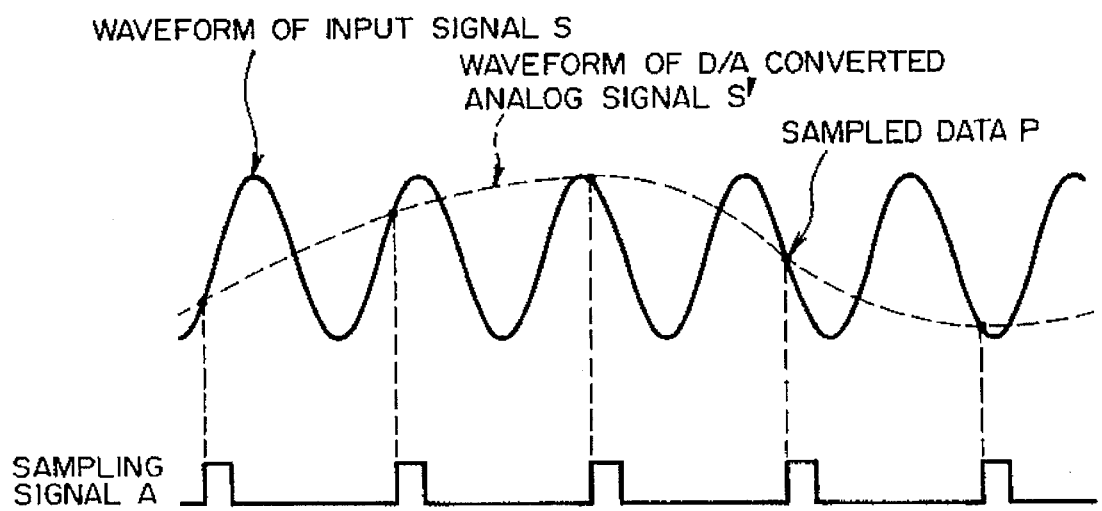
FIG. 6 is a waveform diagram illustrating the phenomenon of aliasing.

The operation of this second embodiment of the aliasing detecting apparatus will now be described by reference to a timing chart shown in FIG. 4. In this second embodiment of the aliasing detecting apparatus, the A/D converter 31 converts an analog input signal S into digital data K as shown in FIG. 4 and supplies the digital data K to the peak detector circuits 32 and 33. As shown in FIG. 4, the frequency of the sweep clock signal I generated from the timebase circuit 36 is divided by the factor of two by the frequency divider 37 to appear as an output pulse signal J. In the peak detection mode in which this pulse signal J is in its high level, the peak detector circuits 32 and 33 detect the maximum value E and the minimum value H of the digital data output K from the A/D converter 31 at the time interval of the every other one of sweep clock pulses I generated from the timebase circuit 36. As shown in FIG. 4, a peak detection mode and an aliasing detection mode are respectively performed in every other cycle of sweep clock pulses I and each cycle of the sweep clock pulses represents one sweep cycle.

On the basis of the detected maximum and minimum values E and H of the digital data K, the peak detector circuits 32 and 33 calculate two reference values (x) and (y) of respective aliasing detection levels F and G as shown in FIG. 4. The manner of calculation of these two reference values (x) and (y) is, for example, such that the reference value (x) is calculated to represent the data in which each of the least significant four bits of the maximum value E is "0", while the reference value (y) is calculated to represent the data in which each of the least significant four bits of the minimum value H is "1". That is, when the detected maximum value E of the input signal S is AAh, the reference value (x) is represented by A0h, while when the detected minimum value H of the input signal S is 55 h, the reference value (y) is represented by 5 Fh.

In the aliasing detection mode in which the output pulse signal J of the frequency divider 37 is in its low level, the peak detector circuits 32 and 33 compare the input data with the reference values (x) and (y) at the time interval of the sweep clock pulses I generated from the frequency divider 37. When the result of comparison proves that data of a input signal level exceed the reference value (x) or (y), the peak detector circuit 32 or 33 outputs a signal L or M respectively and the aliasing detection counter 34 or 35 counts the signal L or M respectively. When the counts of the respective counters 34 and 35 exceed a predetermined number of times, this means occurrence of aliasing, and the counter 34 or 35 generates its output signal N or O having a waveform as shown in FIG. 4 respectively, and these signals N and O are supplied to the CPU 38. As soon as the CPU 38 receives the signal N or O, the CPU 38 displays on the CRT 39 the message indicating occurrence of the aliasing.

Furthermore, the data of peak values E and H detected by the peak detector circuits 32 and 33 are supplied to associated memories respectively which store the waveform data to be used for display on the CRT 39.

According to the second embodiment of the aliasing detecting apparatus described above, the maximum and minimum values of the digital data obtained by the A/D conversion of the analog input signal S between the sweep clock pulses are first detected by the peak detector circuits 32 and 33 respectively, and the reference values (x) and (y) are determined by calculation on the basis of the analog input signal S. Then, whether or not the level of the digital data signal K exceeds the calculated reference values within the period of time between the sweep clock pulses is detected by comparison in the peak detector circuits 32 and 33. The results of the comparison are counted by the respective aliasing detection counters 34 and 35, and the output signals of these counters 34 and 35 are supplied to the CPU 38. When the output signal of the counter 34 or 35 indicates occurrence of aliasing, the CPU 38 displays the message on the CRT 39.

It will be understood from the foregoing description that the aliasing detection counters are additionally provided in the aliasing detecting method and apparatus of the present invention. For example, the aliasing detection counter detects occurrence of aliasing by counting the number of trigger pulses appearing within the period of time between sweep clock pulses, so that the message indicating occurrence of aliasing can be displayed on the CRT.

In another embodiment of the present invention, the aliasing detection counters are added to the peak detector circuits functioning to detect the peak values of the input signal. For example, the aliasing detection counters count the number of the peak values exceeding the predetermined reference values within the period of time between sweep clock pulses, so that occurrence of aliasing can be more accurately detected.

I claim:

1. A method for detecting occurrence of aliasing in a digital oscilloscope having at least one channel of signal input circuit for receiving a signal to be measured, a trigger signal generator circuit for generating a trigger signal when a level of said signal to be measured exceeds a predetermined level, and means for starting sweeping with a predetermined sweep cycle in response to said trigger signal so as to display said signal to be measured, said method comprising the steps of:

counting a number of said trigger signals of the channel generated in each period of the sweep cycle and generating an aliasing detection signal when a counted number of said trigger signals exceeds a predetermined number; and displaying occurrence of aliasing on a display unit in response to said aliasing detection signal.

2. An apparatus for detecting occurrence of aliasing in a digital oscilloscope having at least one channel of signal input circuit for receiving a signal to be measured, a trigger signal generator circuit for generating a trigger signal when a level of said signal to be measured exceeds a predetermined level, and means for starting sweeping with a predetermined sweep cycle in response to said trigger signal so as to display said signal to be measured, said apparatus comprising:

an aliasing detection counter for counting a number of said trigger signals of the channel generated in each period of the sweep cycle and generating on aliasing detection signal when a counted number of said trigger signals exceeds a predetermined number;

a clock generator circuit for supplying said aliasing detection counter with a clock signal having a period that is as long as a period of the sweep cycle; and means for displaying occurrence of aliasing on a display unit in response to said aliasing detection signal.

3. An apparatus according to claim 2, wherein said digital oscilloscope has plural channels of signal input circuits for receiving signals to be measured respectively, a plurality of trigger signal generator circuits each generating a trigger signal when a level of said signal to be measured applied to the associated signal input circuit exceeds a predetermined level, and means for starting sweeping with a predetermined sweep cycle in response to one of said trigger signals so as to display said input signals to be measured, and said aliasing detection counter is connected to each of said plurality of signal trigger generator circuits belonging to said plural channels respectively.

4. A method for detecting occurrence of aliasing in a digital oscilloscope, having at least one channel of signal input circuit for receiving a signal to be measured, said method comprising the steps of:

converting said signal to be measured into digital data;

detecting at least one of a maximum value and a minimum value of said digital data of the channel in a first predetermined period of every other said sweep cycle thereby setting at least one of a first reference value and a second reference value;

generating a first output signal when a value of said digital data is larger than the first reference value in a second predetermined period that alternates with said first predetermined period in case the first reference value was set in the first predetermined period, and generating a second output signal when the value of said digital data is smaller than the second reference value in the second predetermined period in case the second reference value was set in the first predetermined period;

counting a number of said first output signals and generating a first aliasing detection signal when a counted number of said first output signals exceeds a predetermined number in case the first reference value was set in the first predetermined period, and counting a number of said second output signals and generating a second aliasing detection signal when a counted number of said second output signals exceeds a predetermined number in case the second reference value was set in the first predetermined period; and displaying occurrence of aliasing on a display unit in response to at least one of said first and second aliasing detection signals.

5. A method according to claim 4, wherein:

both of the maximum value and the minimum value of said digital data of the channel are detected in the first predetermined period so as to set both of the first reference value and the second reference value;

said first output signal is generated when the value of said digital data is larger than the first reference value in the second predetermined period, and said second output signal is generated when the value of said digital data is smaller than the second reference value in the second predetermined period and said first aliasing detection signal is generated when the number of said first output signals counted in the second predetermined period exceeds the predetermined number, and said second aliasing detection signal is generated when the number of said second output signals counted in the second predetermined period exceeds the predetermined number.

6. An apparatus for detecting occurrence of aliasing in a digital oscilloscope, having at least one channel of signal input circuit for receiving a signal to be measured, said apparatus comprising:

an A/D converter for converting said signal to be measured into digital data;

at least one of a first peak detector circuit and a second peak detector circuit, said first peak detector circuit detecting a maximum value of said digital data of the channel in a first predetermined period of every other said sweep cycle to set a first reference value and generating an output signal when a value of said digital data is larger than the first reference value in a second predetermined period that alternates with said first predetermined period, while said second peak detector circuit detects a minimum value of said digital data of the channel in the first predetermined period to set a second reference value and generates an output signal when the value of said digital data is smaller than the second reference value in the second predetermined period;

at least one of a first aliasing detection counter and a second aliasing detection counter, said first aliasing detection counter counting a number of said output signals from said first peak detector circuit in the second predetermined period and generating an output signal when a counted number of the output signals from said first peak detector circuit exceeds a predetermined number, while said second aliasing detection counter counts a number of said output signals from said second peak detector circuit in the second predetermined period and generates an output signal when a counted number of the output signals from said second peak detection circuit exceeds a predetermined number;

a clock generator circuit for supplying a clock signal having a period that is as long as a period of the sweep cycle to at least one of said first and second peak detector circuits and to at least one of said first and second aliasing detection counters; and means for displaying occurrence of aliasing on a display unit in response to at least one of the output signals from said first and second aliasing detection counters.

7. An apparatus according to claim 6, wherein said apparatus comprises:

both of said first peak detector circuit and said second peak detector circuit; and both of said first aliasing detection counter and said second aliasing detection counter.

\* \* \* \* \*